United States Patent
Murphy et al.

(10) Patent No.: US 7,052,925 B2
(45) Date of Patent: May 30, 2006

(54) METHOD FOR MANUFACTURING SELF-COMPENSATING RESISTORS WITHIN AN INTEGRATED CIRCUIT

(75) Inventors: William J. Murphy, North Ferrisburgh, VT (US); Edmund J. Sprogis, Underhill, VT (US); Anthony K. Stamper, Williston, VT (US); Erick G. Walton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 10/709,039

(22) Filed: Apr. 8, 2004

(65) Prior Publication Data

US 2005/0227449 A1 Oct. 13, 2005

(51) Int. Cl.
*H01L 31/26* (2006.01)

(52) U.S. Cl. .................. 438/48; 438/210; 438/238; 338/275; 338/330; 29/610.1; 29/612

(58) Field of Classification Search .................. None
See application file for complete search history.

(56) References Cited

U.S. PATENT DOCUMENTS

| | | | |
|---|---|---|---|
| 5,134,088 A | * | 7/1992 | Zetterlund .................. 438/210 |
| 5,422,298 A | | 6/1995 | Jiminez |
| 5,680,092 A | | 10/1997 | Yamada et al. |
| 5,683,566 A | | 11/1997 | Hetzler |
| 6,507,993 B1 | | 1/2003 | Dunn |
| 6,534,374 B1 | | 3/2003 | Johnson et al. |

* cited by examiner

*Primary Examiner*—Dung A. Le
(74) *Attorney, Agent, or Firm*—Anthony J. Canale; Dillon & Yudell LLP

(57) ABSTRACT

A method for manufacturing a self-compensating resistor within an integrated circuit is disclosed. The self-compensating resistor includes a first resistor and a second resistor. The first resistor having a first resistance value is initially formed, and then the second resistor having a second resistance value is subsequently formed. The second resistor is connected in series with the first resistor. The second resistance value is less than the first resistance value, but the total resistance value of the first and second resistors lies beyond a desired target resistance range. Finally, an electric current is sent to the second resistor to change the dimension of the second resistor such that the total resistance value of the first and second resistors falls within the desired target resistance range.

8 Claims, 1 Drawing Sheet

METHOD FOR MANUFACTURING SELF-COMPENSATING RESISTORS WITHIN AN INTEGRATED CIRCUIT

BACKGROUND OF INVENTION

1. Technical Field

The present invention relates to integrated circuits in general, and, in particular, to resistors within integrated circuits. Still more particularly, the present invention relates to a method for manufacturing a self-compensating resistor within an integrated circuit.

2. Description of Related Art

It is often desirable for all resistors within an integrated circuit device to have an identical target resistance. However, most process controls for manufacturing resistors on a wafer fall short of the above-mentioned goal. As a result, the resistances of various resistors tend to vary from chip to chip on the same wafer, and from wafer to wafer on the same lot.

The industry standard specifications for demanding resistance uniformity of all resistors on a wafer are getting progressively tighter over the years. In order to meet the industry standard specifications, there are three options that exist today for insuring identical resistances on all resistors on a wafer, and they are:

1. manufacture extra resistors on a wafer for subsequent sorting;
2. use laser ablations; and
3. design in-circuit active impedance control to compensate for process variability.

However, each of the above-mentioned three options has its own problem. The first option is relatively expensive and is not consistent with manufacturing techniques. The second option is not consistent with the standard complementary metal oxide semiconductor (CMOS) process flow. The third option takes up space, increases complexity, and may lead to overall performance degradation.

Consequently, it would be desirable to provide an improved method for manufacturing resistors having an uniform resistance.

SUMMARY OF INVENTION

In accordance with a preferred embodiment of the present invention, a self-compensating resistor includes a first resistor and a second resistor. The first resistor having a first resistance value is initially formed, and then the second resistor having a second resistance value is subsequently formed. The second resistor is connected in series with the first resistor. The second resistance value is less than the first resistance value, but the total resistance value of the first and second resistors lies beyond a desired target resistance range. Finally, an electric current is sent to the second resistor to change the dimension of the second resistor such that the total resistance value of the first and second resistors falls within the desired target resistance range.

All objects, features, and advantages of the presinvention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

In accordance with a preferred embodiment of the present invention, each precision resistor within an integrated circuit that is required to have a common target resistance value is made up of two resistors connected in series. The first of the two resistors contributes to most of the total resistance and is subject to the process variability described previously. The second of the two resistors provides additional resistance that can be tuned during the manufacturing process to compensate for process variability in the first of two resistors.

Initially, standard polysilicon resistors are formed with a resistance that is lower than the desired target resistance. Subsequently, an area of wiring connected in series with each polysilicon resistor that will become a second resistor is exposed with a reactive ion etching (RIE) process. Next, current is passed through all resistors via the substrate when the resistors are in an electropolishing (i.e., reverse plating) bath. The time for the resistors to be in the electropolishing path is set according to the overall impedance through all the resistors to the electropolishing bath in order to insure the desired target resistance for the precision resistors. The exposed wiring areas are etched at a rate that is inversely proportional to the resistance of each corresponding standard polysilicon resistor (rate proportional to the current through the standard polysilicon resistor). As such, the resistor formed in the wiring layer has a higher resistance if it is in series with a polysilicon resistor having lower than target resistance and lower resistance if it is in series with a polysilicon resistor with higher than the desired target resistance. As a result, the final precision resistors have less variations from resistor pairs to resistor pairs.

Figure 1:
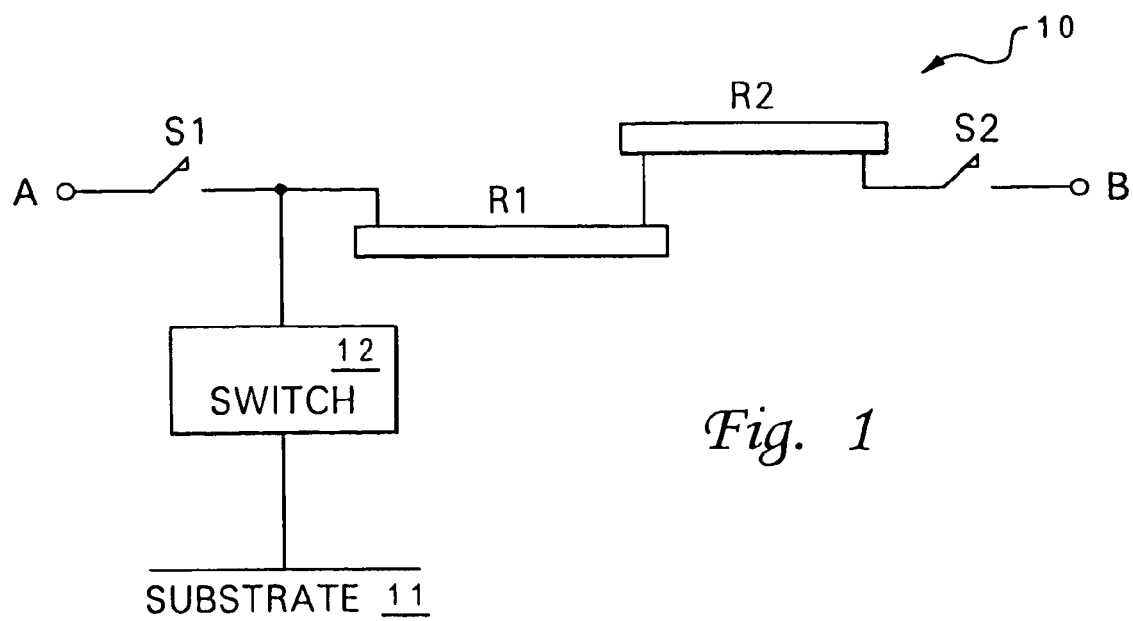
FIG. 1 is a diagram of a self-compensating resistor within an integrated circuit, in accordance with a preferred embodiment of the present invention.

Referring now to the drawings and in particular to FIG. 1, there is depicted a self-compensating resistor, in accordance with a preferred embodiment of the present invention. As shown, a precision resistor 10 is a combination of a resistor R1 and a resistor R2 formed between a node A and a node B. Nodes A and B can be, but do not need to be, connected until later in the process with subsequent wiring levels. Resistor R1 is preferably made of polysilicon, and resistor R2 must be made of platable material such as thin copper wiring. In addition, resistors R1 and R2 can be coefficient of thermal expansion (CTE) compensating materials. The resistance of resistor R1 is greater than the resistance of resistor R2. A switch 12 is connected between resistor R1 and substrate 11. Switch 11 can be a gated transistor, a fuse, or an n diffusion within a p substrate. Resistor R2 can be auto-trimmed by a electropolishing process to compensate for process variations in resistor R1 during manufacturing. During the electropolishing process, only a connection between a substrate 11 and resistor R2 through resistor R1 is needed (i.e., switches S1 and S2 are opened).

Standard damascene method is used for the preparation of the above-mentioned resistor such that copper is deposited in the damascene features. Excess copper is removed by chemical mechanical polishing (CMP). A thin capping layer, such as silicon nitride, is placed over the entire substrate.

Photoresist is applied to expose an opening in photoresist over resistor R2 regions such that only RIE through nitride cap. For an electropolished wafer, wafer substrate is biased positive with respect to a counter-electrode immersed in the electroplating bath. During the electropolishing process, the copper thickness of resistor R2 is reduced in proportion to current through switch 12 and resistor R1. All other metal lines at the resistor R2 level are protected from electropolishing by the photoresist. After the electropolishing process has been completed, the photoresist is then stripped. Next, precision resistor 10 continues with standard backend-of-the-line (BEOL) steps to connect completing connections to nodes A and B.

For process control, the electropolishing current can be monitored by measuring the current passing through resistor R1 to switch 12. An electropolishing endpoint is set according to the overall electropolishing current as it compares to an experimentally determined target value to ensure that wafer-wafer variations in resistor R1 are eliminated. The wafer variations of resistor R1 are self-compensated by the difference in polishing rates that will occur in R2 formation.

Alternatively, process control for improving variability from manufacturing unit to manufacturing unit can also be accomplished by monitoring other characteristics of a circuit formed in the electropolishing bath. Such characteristics include:

i. setting time in bath based on initial current reading according to experimentally determined reference;

ii. depletion of copper etch rate will show that areas exposed to the bath are depleting in copper;

iii. a drop in current shows that areas exposed to the bath are depleting in copper.

Taking into account manufacturing variability, a starting resistance can be chosen that allows resistances of resistors on a single manufacturing unit to converge to within a target tolerance value during an electropolishing step. Furthermore, the overall current, resistance, or other bath parameters of all resistors in the electroplating bath can be referenced to the control of the timing in the electroplating bath to ensure resistance repeatability from one precision resistor to another.

Resistor R2 can be connected in parallel with an additional resistor that is not being electropolished in the electropolishing bath. Such connection would provide for a maximum resistance even if resistor R2 was allowed to be removed.

A single shunted resistor embodiment is also available. Resistors are formed out of a platable material on top of a non-platable liner. A portion of like resistors to be adjusted are exposed and biased. The platable material is removed from the biased resistors at a rate that is inversely proportional to the resistance of the biased remaining portion of the resistor. Connections between the two nodes of the resistor is maintained through the liner and may be additionally bound by a parallel resistor that can be utilized as in the preferred embodiment to insure that a maximum resistance is not exceeded.

Figure 2:
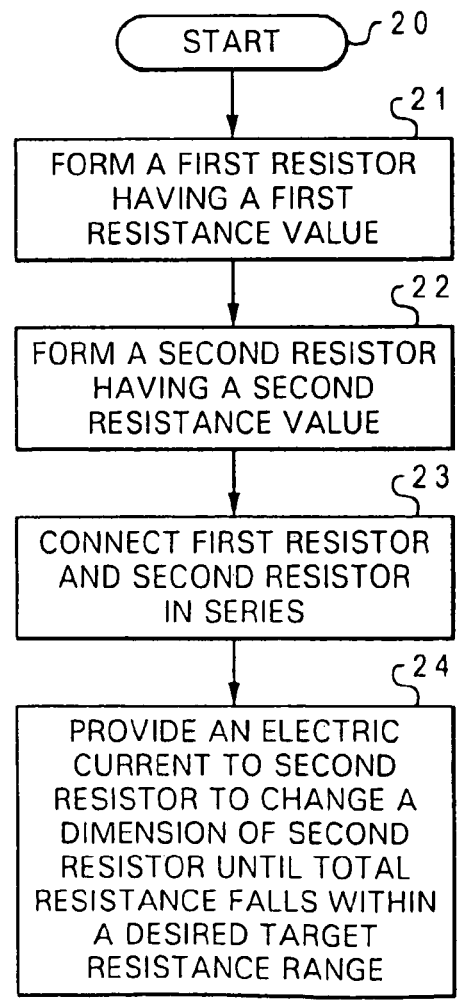
FIG. 2 is a high-level logic flow diagram of a method for manufacturing the self-compensating resistor from FIG. 1, in accordance with a preferred embodiment of the present invention.

With reference now to FIG. 2, there is depicted a high-level logic flow diagram of a method for manufacturing self-compensating resistor 10 from FIG. 1, in accordance with a preferred embodiment of the present invention. Starting at block 20, a first resistor having a first resistance value is initially formed, as shown in block 21. Then, a second resistor having a second resistance value less than the first resistance value is formed, as depicted in block 22. The second resistor in then connected in series with the first resistor, as shown in block 23. The total resistance of the first and second resistors lies outside a desired target resistance range of a precision resistor. An electric current is provided to the second resistor situated in an electropolishing bath to change a dimension of the second resistor via an electropolishing process, as depicted in block 24, such that the total resistance of the first and second resistors falls within the desired target resistance range.

In general, the present invention works best for improving resistors of a common target resistance. In order to address design requirements for multiple types of resistors, the electropolishing process can be repeated for different groups of identical resistor types in order to expose each group of resistor types to the electropolishing bath. After electropolishing one group of resistor types, photoresist and block level are reapplied in order to expose the next group of resistor types. In addition, circuitry can be designed to maximize grouping of resistor types and utilize series and parallel connections as needed to make the desired target resistances. For example, if a device calls for mostly 1 kS precision resistors and several 4 kS precision resistors, then the device should be built with all 1 kS resistors and a self-compensating process to utilize to put four 1 kS resistors in series wherever a 4 kS resistor is required during the final wiring stage.

As has been described, the present invention proan improved method for manufacturing a self-compensating resistor within an integrated circuit. The present invention provides a self-tuning step where all resistors of a common type on a given manufacturing unit (such as a wafer) can be simultaneously tuned to reduce within unit variability and to drive towards a desired target resistance by biasing a resistor and exposing part of the resistor (or a connected supplemental resistor) in an electropolishing bath. In addition, the present invention provides a self-tuning step where all like resistors on a manufacturing unit can be biased and some part of each resistor or connecting resistor is exposed in an electropolishing bath. Each individual resistor has controls over the amount of electropolishing that takes place in the exposed area.

The present invention allows the resistance of a low-resistance resistor to be increased faster than the resistance of a higher resistance resistor in a common electropolishing bath, reducing variations between resistors and, if desired, adjusting resistances towards a target resistance.

The present invention is better than laser ablation because all resistors are adjusted simultaneously in the electropolishing bath and the overall current to the electropolishing bath provides the necessary feedback control. With laser ablation, contact for feedback measurement and trimming would need to be done on individual resistors. The present invention is also an improvement over active impedance control in circuitry because only minimal excess circuitry is required to yield significantly more consistent resistance.

While the invention has been particularly shown and described with reference to a preferred embodiment, it will be understood by those skilled in the art that various changin form and detail may be made therein without departing from the spirit and scope of the invention.

The invention claimed is:

1. A method of manufacturing a precision resistor on a substrate, said method comprising:

forming a first resistor having a first resistance value;

forming a second resistor having a second resistance value less than said first resistance value;

connecting said second resistor in series with said first resistor, wherein a total resistance of said first and second resistors falls outside a target resistance range; and providing an electric current to said second resistor to change a dimension of said second resistor such that said total resistance falls within the target resistance range; wherein said first resistor is made of polysilicon and said second resistor is made of thin copper wiring.

2. The method of claim 1, wherein said total resistance of said first and second resistors is greater than said target resistance range.

3. The method of claim 1, wherein said first resistor is made of polysilicon and said second resistor is made of platable material.

4. The method of claim 1, wherein said second resistor are electropolished at a rate that is inversely proportional to the resistance of said first resistor.

5. An apparatus for manufacturing a precision resistor on a substrate, said apparatus comprising:

means for forming a first resistor having a first resistance value;

means for forming a second resistor having a second resistance value less than said first resistance value;

means for connecting said second resistor in series with said first resistor, wherein a total resistance of said first and second resistors falls outside a target resistance range; and means for providing an electric current to said second resistor to change a dimension of said second resistor such that said total resistance falls within the target resistance range; wherein said first resistor is made of polysilicon and said second resistor is made of thin copper wiring.

6. The apparatus of claim 5, wherein said total resistance of said first and second resistors is greater than said target resistance range.

7. The apparatus of claim 1, wherein said first resistor is made of polysilicon and said second resistor is made of platable material.

8. The apparatus of claim 5, wherein said second resistor are electropolished at a rate that is inversely proportional to the resistance of said first resistor.

* * * * *